United States Patent [19]

Vogel et al.

[11] Patent Number: 5,497,010
[45] Date of Patent: Mar. 5, 1996

[54] HIGH-VOLTAGE SEMICONDUCTOR DEVICE

[75] Inventors: Manfred Vogel, Ditzingen-Heimerdingen; Werner Herden, Gerlingen; Volkmar Denner, Pfullingen; Anton Mindl, Tuebingen, all of Germany

[73] Assignee: Robert Bosch GmbH, Stuttgart, Germany

[21] Appl. No.: 78,281

[22] PCT Filed: Nov. 16, 1991

[86] PCT No.: PCT/DE91/00900

§ 371 Date: Jun. 16, 1993

§ 102(e) Date: Jun. 16, 1993

[87] PCT Pub. No.: WO92/11659

PCT Pub. Date: Jul. 19, 1992

[30] Foreign Application Priority Data

Dec. 22, 1990 [DE] Germany .............. 40 41 581.3
Mar. 16, 1991 [DE] Germany .............. 41 08 611.2

[51] Int. Cl.⁶ .......................... H01L 29/74; H01L 31/111
[52] U.S. Cl. .......................... 257/113; 257/122; 257/162; 257/653
[58] Field of Search .................. 257/109, 110, 257/113, 119, 120, 122, 126, 128, 132, 653, 162

[56] References Cited

U.S. PATENT DOCUMENTS 3,015,762  1/1962  Shockley .................. 257/653
5,136,348  8/1992  Tsuzuki et al. ............ 257/653

FOREIGN PATENT DOCUMENTS 1570872   6/1969  France .
3731393   4/1989  Germany .
59-098533 6/1984  Japan .
2011712   7/1979  United Kingdom .
8902527   3/1989  WIPO .

OTHER PUBLICATIONS

Sze, S. M., *Physics of Semiconductor Devices*, John Wiley, 1981, pp. 224–227.

*Primary Examiner*—Sara W. Crane
*Attorney, Agent, or Firm*—Michael J. Striker

[57] ABSTRACT

The high-voltage semiconductor device includes a single chip having a plurality of semiconductor elements connected in series with each other which includes an insulating substrate (2); a monocrystalline semiconductor carrier (1) of a first conductivity type applied to the insulating substrate (2); at least two terminals (5,6) located on opposite sides of the chip; strip-like areas (3) of a second conductivity type formed in the monocrystalline semiconductor carrier (1), the strip-like areas (3) each extending across the semiconductor carrier (1) at right angles to a longitudinal direction between the at least two terminals, forming pn junctions in the semiconductor carrier (1), being spaced from each other in the longitudinal direction over the single chip and penetrating an entire thickness of the semiconductor carrier; at least one doped region (7) in the strip-like areas (3) forming an at least four layered component in the single chip; and a light responsive device for reducing a switching voltage of the single chip when the pn junctions are irradiated with light.

20 Claims, 2 Drawing Sheets

5,497,010

HIGH-VOLTAGE SEMICONDUCTOR DEVICE

BACKGROUND OF THE INVENTION

The invention relates to a high-voltage switch having a plurality of semiconductor elements connected in series. EP-A-0,377,619 has already disclosed a high-voltage switch which takes over the function of an igniting voltage distributor in the case of steady-state high-voltage distribution, This high-voltage switch consists of semiconductor elements which are arranged in a cascade and are constructed as high-voltage transistors or thyristors, the cascade having light-sensitive zones. The light-sensitive zones can be driven by light-emitting elements in such a way that they switch through at a predetermined instant, for example in accordance with the ignition sequence, and thereby apply the ignition pulses, delivered by the ignition coil, to the downstream sparking plug, In these cascade circuits, 3 to 50 phototransistors or photothyristors are connected in series.

A high-voltage switch is likewise disclosed by German Published Patent Application 3,731,393, Use is made here of break-over diodes as the high-voltage elements, 10 to 50 diodes being stacked one above the other, depending on the dielectric strength of the individual break-over diode and depending on the desired break-over voltage, It is disadvantageous in these known high-voltage switches that the cascade circuit in the form of series circuits, or the stacks require a relatively large amount of room.

SUMMARY OF THE INVENTION

It is an object of the present invention to provide an improved semiconductor device which does not have the disadvantages of the prior art devices described above.

According to the invention the high-voltage semiconductor device includes a single chip having a plurality of semiconductor elements connected in series with each other and including an insulating substrate; a monocrystalline semiconductor carrier of a first conductivity type applied to the insulating substrate; at least two terminals located on opposite sides of the chip; strip-like areas of a second conductivity type formed in the monocrystalline semiconductor carrier, wherein the strip-like areas each extend across the semiconductor carrier at right angles to a longitudinal direction between the at least two terminals, form pn junctions in the semiconductor carrier, are spaced from each other in the longitudinal direction and penetrate an entire thickness of the semiconductor carrier; at least one doped region in the strip-like areas forming an at least four layered component in the single chip, and a light responsive device for reducing a switching voltage of the single chip when the pn junctions are irradiated with light.

The arrangement according to the invention has, by contrast, the advantage that only one Si chip, which is consequently structured with juxtaposed semiconductor elements, is used. The entire chip surface is thereby reduced by approximately 50% by comparison with the stacking technique.

Various embodiments of the invention provide a number of additional advantageous features. It is particularly advantageous that, by applying the Si wafer to an insulating substrate, only at least three free sides, preferably the two longitudinal sides and the top side, have to be surrounded by a partially transparent insulator.

A further advantage is the lateral homogeneous current distribution in the wafer. Since the entire wafer is involved in the structuring and the light can penetrate approximately 100 μm at a wavelength lambda of approximately 900 nm, which corresponds approximately to the entire depth of the wafer, charge carriers can be generated in the entire depth of the wafer.

BRIEF DESCRIPTION OF THE DRAWING

The objects, features and advantages of the present invention will now be illustrated in more detail by the following detailed description, reference being made to the accompanying drawing in which.

DESCRIPTION OF THE PREFERRED EMBODIMENT

Figure 1:
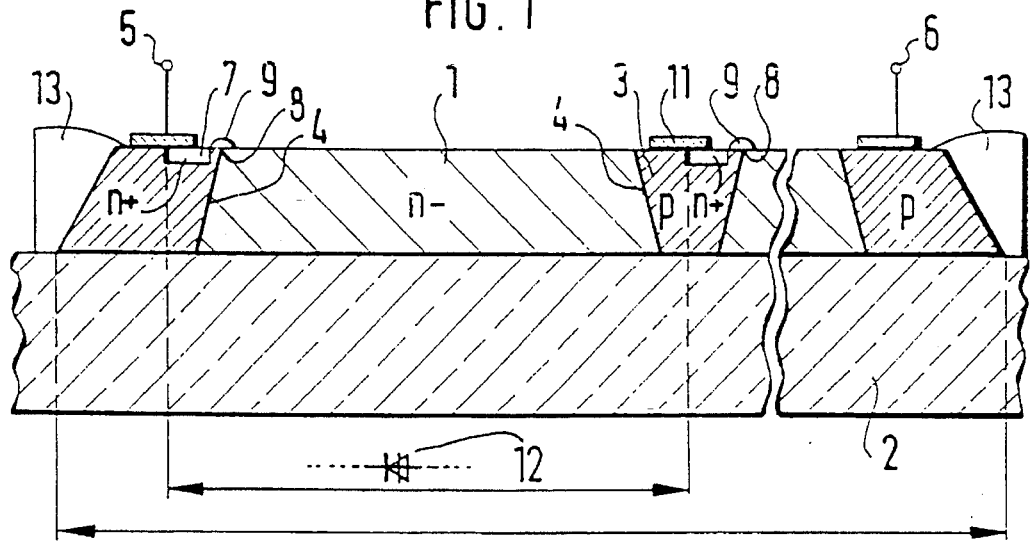
FIG. 1 is a diagrammatic cross-sectional view through a single chip containing the break-over diode cascade according to the invention.

FIG. 1 shows in cross-section the structure of a break-over diode cascade in a single chip in planar technology. The planar break-over diode cascade consists of a monocrystalline semiconductor carrier, in particular a silicon wafer 1, which has a thickness of about 50 to 200 micrometers, is n-doped, and is applied on its underside to an insulating substrate 2, for example glass, ceramic, sapphire or the like. Located in this silicon wafer are a plurality of p-doped areas 3 which extend through the n-doped silicon up to the insulating substrate 2, so that pn junctions 4 are produced. The p-doped areas are strip-like, are spaced at predetermined distances from each other, for example, 490 micrometers and extend over the entire width of the single chip at right angles to the longitudinal direction from the terminal 5 to the terminal 6, and have a width of, for example, 110 micrometers. In the structuring of the silicon wafer 1 by p-diffusions, care must be taken that no continuous ohmic path is produced, in order to guarantee the isolation of the underside of the wafer by the insulating layers 2. That is to say, care must be taken that the p-diffusion really is performed up to the underside of the wafer. It is for this reason that it is preferable to use a wafer which is approximately 100 μm thin. Strip-shaped $n^+$ areas 7 are diffused into the p-doped areas 3 of the silicon wafer 1. It is also possible for the $n^+$ areas 7 to be interrupted. The width of these strips 7 is, for example, 50 μm, and the length corresponds to the width of the single chip, which is, for example, 2 mm. The diffusion of $n^+$ dopants into the p-doped areas 3 is not necessary at the terminal 6, since an individual break-over diode 12 is composed of four layers. These four layers consist of $n^+$, p, $n^-$, p. The cascading is finished at the terminating edge of the silicon wafer 1, so that no new $n^+$ layer is necessary for a following individual break-over diode. At the edge regions of the break-over diode cascade thus formed, the p-doped areas 3 are coated with an insulating layer 13 which extends from the top side of the silicon wafer 1 over the edge region as far as the insulating substrate 2. The pn junctions 4 are constructed on the top side of the silicon wafer in such a way that photosensitive windows 8 are produced, that is to say, the insulation of the pn junctions to the outside is performed by oxide or glass passivation 9. In addition, it is possible, for the purpose of increasing the incidence of light, particularly on the longitudinal sides, firstly to provide the pn junctions, with a trench etching, and subsequently to undertake the insulating by an appropriately transparent insulator 13. The layer thickness of the insulating layer 13 can thereby be fixed so that it is matched to the photosensitivity at a specific wavelength of the incident light. Finally, metallic coatings 11 are applied in a strip-like or point-like fashion to the top side, in order to provide corresponding terminals 5 and 6 on the mutually opposite end regions of the single chip. A lateral current flow is produced in this planar break-over diode cascade, the reverse voltage of the cascade being fixed by the reverse voltage of the symbolically indicated individual break-over diodes 12 and by the number thereof. Charge carriers are generated in the entire depth of the silicon wafer by irradiation of the pn junctions, a homogeneous current flow being produced and the breakdown voltage being reduced.

Figure 2:
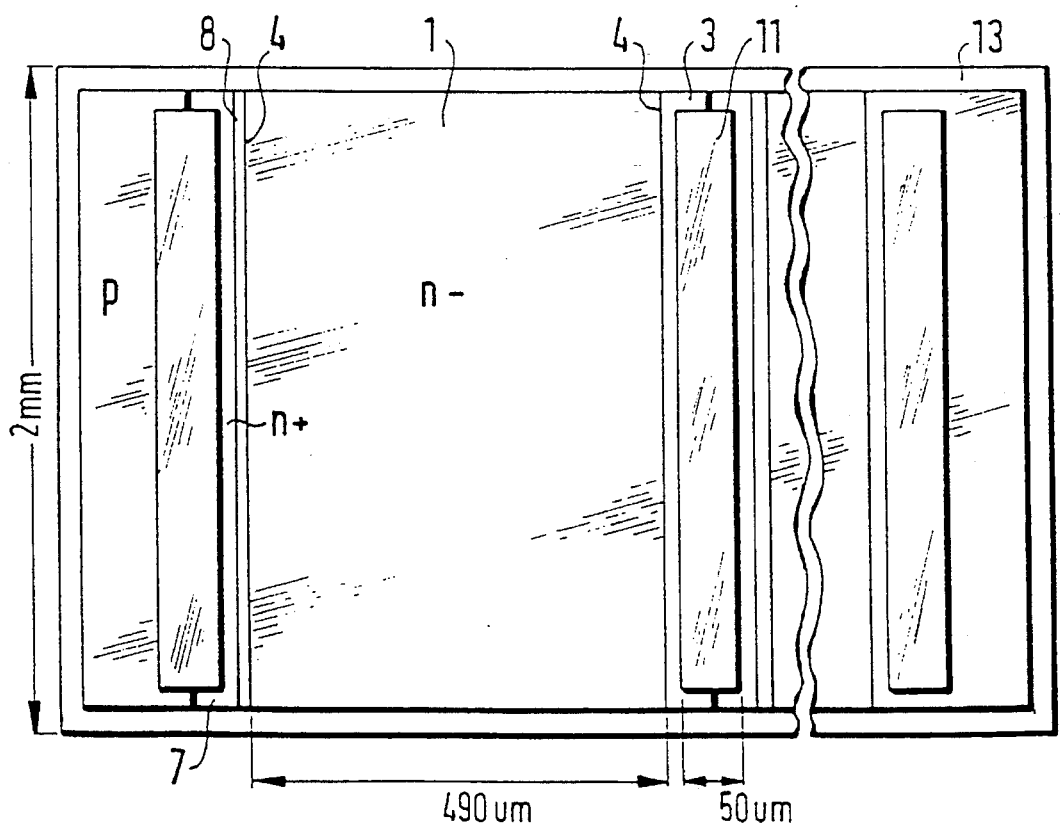
FIG. 2 is a top plan view of the single chip shown in FIG. 1.

FIG. 2 shows the plan view of the single chip in a manner analagous to FIG. 1. The representation of the glass passivation has been dispensed with in the plan view, in order better to illustrate the strip-shaped doped areas. It is clearly to be seen here that the p-doped areas 3 are strip-like and distributed over the entire single chip in the n-doped silicon monocrystal 1, and that the $n^+$ areas 7 are likewise strip-like and distributed over the entire single chip, these $n^+$ areas having a relatively slight penetration depth. In the vicinity of the $n^+$ diffusions, metallic coatings which form the basis for the connection to the terminals 5 and 6 are applied to the structured silicon wafer.

In this case, the metallic coatings 11 short-circuit the $n^+$ areas 7 with the p-area 3 situated therebelow. The pinch resistance (below the $n^+$ area 7) thus produced determines the break-over conditions of the break-over diode element.

Figure 3:
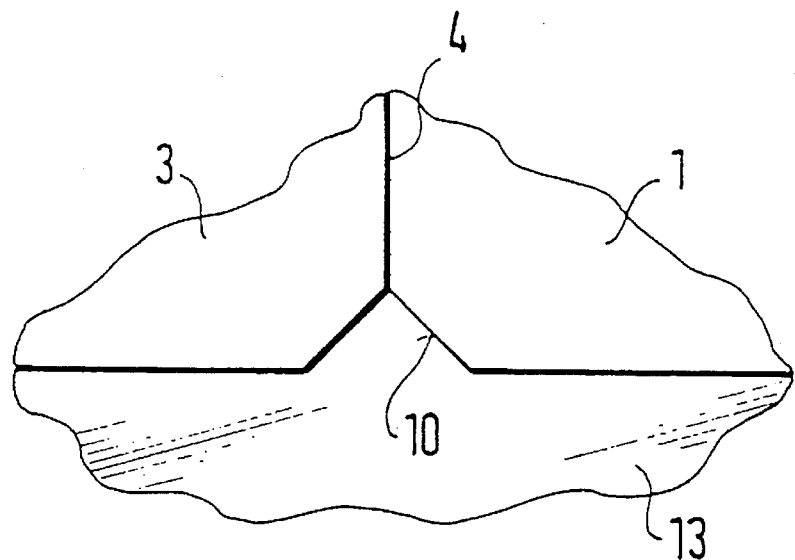
FIG. 3 is a cutaway detailed view of a portion of the chip shown in FIG. 2 showing the junction of monocrystal and the p-doped areas at the edge of the transparent insulator.

FIG. 3 shows a detail from FIG. 2, formation of the pn junctions on the longitudinal sides of the single chip being represented here. The pn junctions can be exposed by trench etching, so that small troughs 10 are produced. These troughs are subsequently filled up with the transparent insulating material 13, so that the longitudinal sides can be used to amplify the effect of charge carrier generation by irradiation with light.

Figure 4:
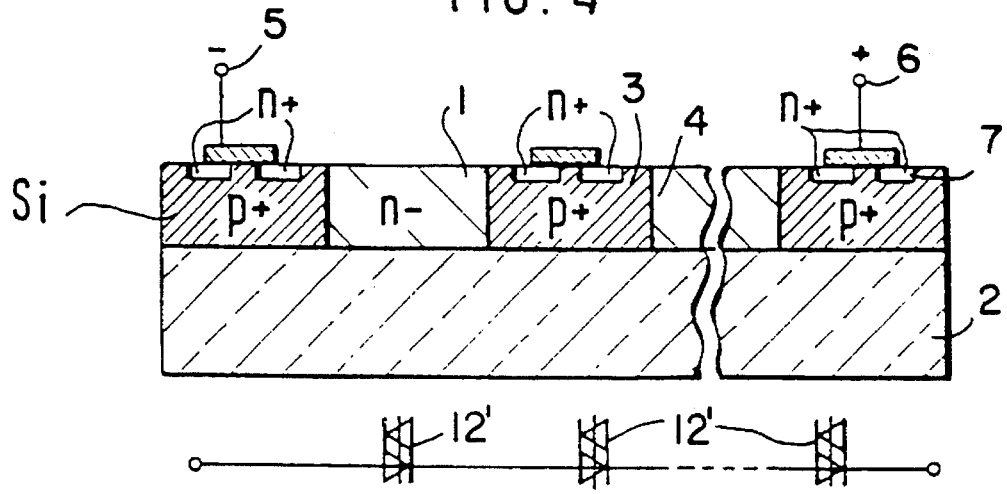
FIG. 4 is a diagrammatic cross-sectional view of a chip showing the cascading of the break-over diodes having symmetry properties (five-layer diode) on a single chip.

FIG. 4 illustrates that the structuring of a monocrystalline n-doped silicon monocrystal also makes possible the formation of cascades of other components, for example break-over diodes having symmetry properties, so-called bipolar break-over diodes. In addition, the cascading is represented symbolically in this figure by circuit symbol 12. Components with the same reference number as in the embodiment shown in FIGS. 1 and 2 have the same name.

It is also possible to form the pn junctions by using a p-doped monocrystalline silicon chip which, for its part, is provided in a strip-like fashion with n-dopings and the p-doped regions inserted therein. All that is important in such a structuring is to use conductivity types of opposite nature.

While the invention has been illustrated and described as embodied in a high-voltage semiconductor device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

We claim:

1. High-voltage semiconductor device comprising a single chip having a plurality of semiconductor elements connected in series with each other, said single chip comprising:

an insulating substrate (2);

a monocrystalline semiconductor carrier (1) of a first conductivity type formed on said insulating substrate (2);

at least two terminals (5,6), said at least two terminals being located on opposite sides of said chip;

a plurality of strip-like areas (3) of a second conductivity type formed in said monocrystalline semiconductor carrier (1), wherein said monocrystalline semiconductor carrier (1) is n-doped and each of said strip-like areas (3) is p-doped and extends across said semiconductor carrier (1) at right angles to a direction between said at least two terminals at said opposite sides and said strip-like areas (3) are spaced from each other in said direction over said single chip and penetrate an entire thickness of said semiconductor carrier to form said semiconductor elements;

an adjoining $n^+$-doped area provided in each of said p-doped strip-like areas (3); and a metallic coating (11) partially covering at least one of said p-doped strip-like areas and said adjoining $n^+$-doped area.

2. High-voltage semiconductor device as defined in claim 1, wherein each of said adjoining $n^+$-doped areas is strip-like and extends along said p-doped strip-like area perpendicular to said direction.

3. High-voltage semiconductor device as defined in claim 1, wherein said n-doped monocrystalline semiconductor carrier (1) comprises a silicon wafer.

4. High-voltage semiconductor device as defined in claim 3, wherein said silicon wafer has a thickness of 50 to 200 micrometers.

5. High-voltage semiconductor device as defined in claim 1, wherein said n-doped monocrystalline semiconductor carrier (1) and said p-doped strip-like areas (3) form pn junctions, said pn junctions have edge portions extending on longitudinal sides of said single chip, said single chip has a trough (10) between each of said p-doped strip-like areas (3) and said n-doped monocrystalline semiconductor carrier (1) in the vicinity of each of said edge portions and further comprising an insulating layer (13) covering each of said edge portions of said pn-junctions on said longitudinal sides and filling said trough.

6. High-voltage semiconductor device as defined in claim 5, further comprising passivation means for insulating said pn junctions, said passivation means being selected from the group consisting of glass coatings and oxide coatings formed on said monocrystalline semiconductor carrier (1) and covering edges of said pn junctions.

7. High-voltage semiconductor device as defined in claim 5, further comprising a light-transmitting passivation means for insulating said pn junctions on a top side of said single chip.

8. High-voltage semiconductor device as defined in claim 1, wherein said at least two terminals includes said metallic coating.

9. High-voltage semiconductor device as defined in claim 5, further comprising light responsive means for reducing a switching voltage of said single chip when said pn junctions are irradiated with light.

10. High-voltage semiconductor device as defined in claim 1, wherein said semiconductor elements are selected from the group consisting of break-over diodes, thyristors and triacs.

11. High-voltage semiconductor device as defined in claim 1, wherein said semiconductor elements include diodes.

12. High-voltage semiconductor device comprising a single chip having a plurality of semiconductor elements connected in series with each other, said single chip comprising:

an insulating substrate (2);

a monocrystalline semiconductor carrier (1) of a first conductivity type formed on said insulating substrate (2);

at least two terminals (5,6), said at least two terminals being located on opposite sides of said chip;

a plurality of strip-like areas (3) of a second conductivity type formed in said monocrystalline semiconductor carrier (1), wherein said strip-like areas (3) each extend across said semiconductor carrier (1) at right angles to a direction between said at least two terminals at said opposite sides, form pn junctions in said semiconductor carrier (1), are spaced from each other in said direction over said single chip and penetrate an entire thickness of said semiconductor carrier, at least one doped region (7) in said strip-like areas (3) forming an at least four layered component in said single chip, and light responsive means for reducing a switching voltage of said single chip when said pn junctions are irradiated with light;

wherein said pn junctions have edge portions extending on longitudinal sides of said single chip and said single chip has a trough (10) between said monocrystalline semiconductor carrier (1) and each of said strip-like areas (3) in the vicinity of each of said edge portions.

13. High-voltage semiconductor device as defined in claim 12, wherein said semiconductor elements are selected from the group consisting of break-over diodes, thyristors and triacs.

14. High-voltage semiconductor device as defined in claim 12, wherein said monocrystalline semiconductor carrier (1) comprises a silicon wafer having a thickness of 50 to 200 micrometers.

15. High-voltage semiconductor device as defined in claim 14, further comprising a metallic coating (11) partially covering at least one of said strip-like areas (3).

16. High-voltage semiconductor device as defined in claim 15, wherein said at least two terminals includes said metallic coating.

17. High-voltage semiconductor device as defined in claim 14, further comprising passivation means for insulating said pn junctions, said passivation means being selected from the group consisting of glass coatings and oxide coatings formed on said monocrystalline semiconductor carrier (1) and covering edges of said pn junctions.

18. High-voltage semiconductor device as defined in claim 14, further comprising a light-transmitting passivation means for insulating said pn junctions on a top side of said single chip.

19. High-voltage semiconductor device as defined in claim 14, wherein the monocrystalline semiconductor carrier (1) is n-doped and said strip-like areas are p-doped.

20. High-voltage semiconductor device as defined in claim 19, wherein said at least one doped region is an $n^+$-doped strip-like region and extends along said p-doped strip-like area perpendicular to said direction.

* * * * *